(12) United States Patent
Koike-Akino et al.

(10) Patent No.: US 9,112,653 B2
(45) Date of Patent: Aug. 18, 2015

(54) METHOD AND SYSTEM FOR MODULATING OPTICAL SIGNALS AS HIGH-DIMENSIONAL LATTICE CONSTELLATION POINTS TO INCREASE TOLERANCE TO NOISE

(71) Applicant: Mitsubishi Electric Research Laboratories, Inc., Cambridge, MA (US)

(72) Inventors: Toshiaki Koike-Akino, Salem, MA (US); Andrei Kniazev, Boulder, CO (US); David S Millar, Somerville, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 130 days.

(21) Appl. No.: 13/921,655

(22) Filed: Jun. 19, 2013

(65) Prior Publication Data

US 2014/0376925 A1 Dec. 25, 2014

(51) Int. Cl.

| H04B 10/04 | (2006.01) |
| H04L 1/00 | (2006.01) |
| H04B 10/516 | (2013.01) |
| H04B 10/556 | (2013.01) |
| H04B 10/50 | (2013.01) |
| H03M 13/25 | (2006.01) |
| H03M 13/29 | (2006.01) |
| H03M 13/00 | (2006.01) |

(Continued)

(52) U.S. Cl.
CPC ............ *H04L 1/0042* (2013.01); *H03M 13/251* (2013.01); *H03M 13/2906* (2013.01); *H03M 13/2966* (2013.01); *H03M 13/6325* (2013.01); *H04B 10/50* (2013.01); *H04B 10/516* (2013.01); *H04B 10/5561* (2013.01); *H04L 1/005* (2013.01); *H04L 1/0041* (2013.01); *H04L 1/0057* (2013.01); *H03M 13/1102* (2013.01); *H03M 13/152* (2013.01); *H03M 13/1505* (2013.01); *H03M 13/1515* (2013.01); *H04L 1/0065* (2013.01)

(58) Field of Classification Search
CPC . H04B 10/118; H04B 10/516; H04B 10/5055
USPC ................................... 398/182–183, 188–190
See application file for complete search history.

(56) References Cited

U.S. PATENT DOCUMENTS

2004/0228419 A1 * 11/2004 Shen et al. .................... 375/265
2006/0044162 A1    3/2006 Fenn et al.

(Continued)

OTHER PUBLICATIONS

E. Agrell and M. Karlsson, "Power-Effcient Modulation Formats in Coherent Transmission Systems." IEEE Journal of Lightwave Technology, vol. 27, Issue 22, pp. 5115-5126, (2009).

(Continued)

*Primary Examiner* — Dzung Tran
(74) *Attorney, Agent, or Firm* — Dirk Brinkman; Gene Vinokur

(57) ABSTRACT

A method modulates data for optical communication by first encoding the data using a forward error correction (FEC) encoder to produce encoded data, which are encoded using a block encoder to produce block encoded data such that Hamming distances between code words that represent the block encoded data are increased. The block encoded data are mapped to produce mapped data such that Euclidian distances between the constellation points are increased. Then, the mapped data are modulated in a transmitter to a modulated signal for an optical channel.

19 Claims, 6 Drawing Sheets

(51) Int. Cl.
*H03M 13/15* (2006.01)
*H03M 13/11* (2006.01)

(56) References Cited

U.S. PATENT DOCUMENTS

| | | | |
|---|---|---|---|
| 2007/0171730 A1* | 7/2007 | Ramamoorthy et al. | 365/185.33 |
| 2008/0232510 A1* | 9/2008 | Golitschek Edler Von Elbwart et al. | 375/298 |
| 2009/0135946 A1* | 5/2009 | Dowling et al. | 375/286 |
| 2012/0141138 A1 | 6/2012 | Yang et al. | |
| 2012/0260142 A1 | 10/2012 | Arabaci et al. | |
| 2013/0058431 A1* | 3/2013 | Fonseka et al. | 375/295 |
| 2014/0068385 A1* | 3/2014 | Zhang et al. | 714/776 |

OTHER PUBLICATIONS

T.Koike-Akino and V.Tarokh, "Sphere Packing Optimization and Exit Chart Analysis for Multi-Dimensional QAM Signaling." IEEE ICC (2009).

Millar et al. "A 24-Dimensional Modulation Format Achieving 6 dB Asymptotic Power Efficiency," Advanced Photonics 2013—Signal Processing in Photonic Communications, SPPCOM 2013. Jul. 14, 2013. p. SPM3D.6.

Adde et al, "Design of an Efficient Maximum Likelihood Soft Decoder for Systematic Short Block Codes," IEEE Transactions on Signal Processing. IEEE Service Center, NY, NY, US. vol. 60, No. 7, Jul. 1, 2012.

* cited by examiner

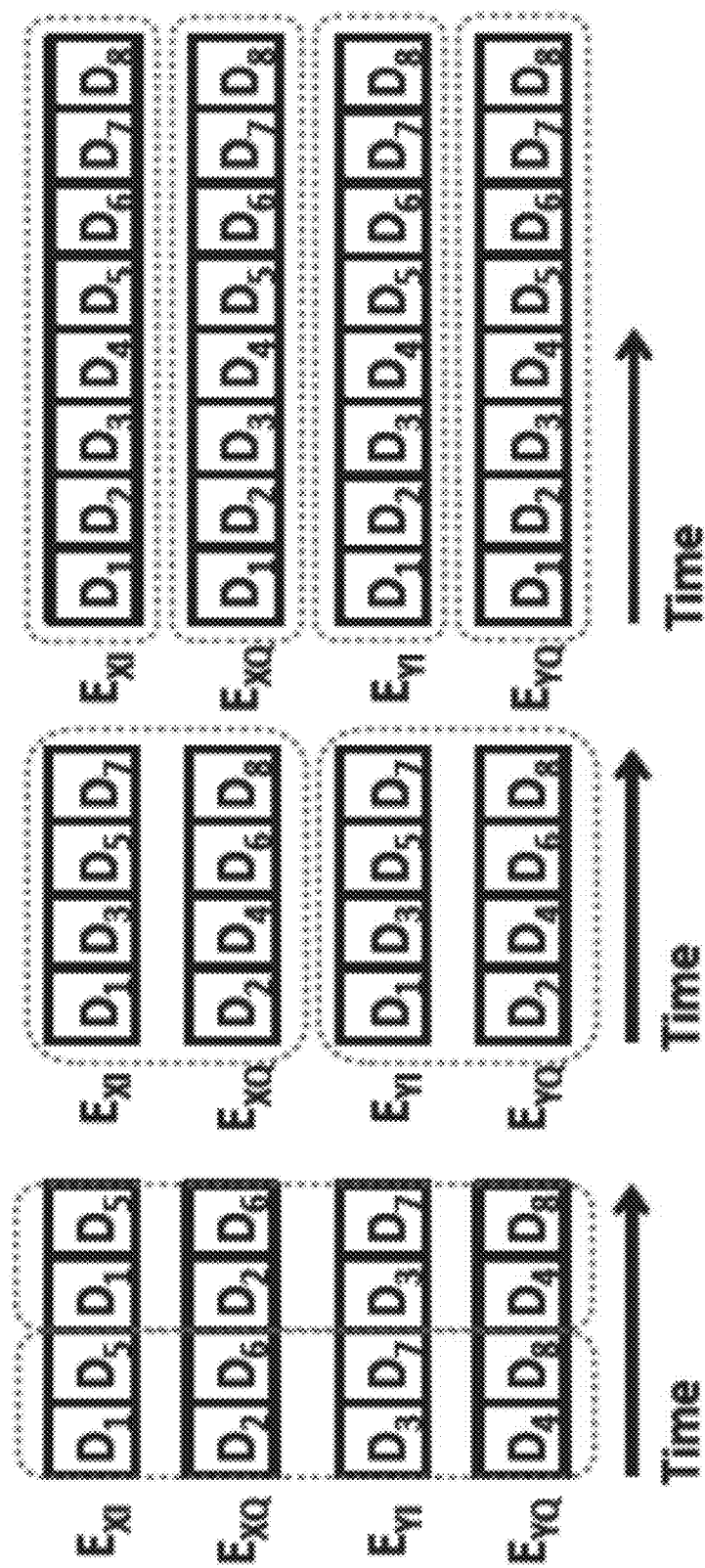

METHOD AND SYSTEM FOR MODULATING OPTICAL SIGNALS AS HIGH-DIMENSIONAL LATTICE CONSTELLATION POINTS TO INCREASE TOLERANCE TO NOISE

FIELD OF THE INVENTION

This invention relates generally to modulating optical signals, and more particularly to modulating the optical signals in multi-dimensions for reliable fiber-optic communications.

BACKGROUND OF THE INVENTION

Optical coherent communication systems are naturally suited for modulation with four-dimensional (4D) signal constellations. Four-dimensional modulation formats can achieve substantial gains compared with conventional formats, such as dual-polarization quaternary phase-shift keying (DP-QPSK) and 16-ary quadrature amplitude modulation (DP-16QAM). Polarization-switched QPSK (PS-QPSK) and set-partitioned 128-ary QAM (SP-128QAM) are known to be practical 4D constellations, and they can achieve 1.76 dB and 2.43 dB gains in asymptotic power efficiency, respectively. Gains of up to 1.5 dB can be achieved with forward-error correction (FEC). While some higher-dimensional modulation formats are known, their application to optical communications has been limited to the 4D case because of their increased complexity.

SUMMARY OF THE INVENTION

The embodiments of the invention provide a method and system for modulating an optical signal for reliable fiber-optic communications. The method can use a short block code to increase Hamming and Euclidian distances between constellation points over a high-dimensional lattice representing the data. In one embodiment, the method uses an extended Golay code for a 24-dimensional (24D) hypercube lattice, or a parity code in 8D hypercube lattice. For other dimensions, known near perfect codes can be used in conjunction with cubic lattice constellations. Another embodiment uses nonlinear codes over densest hypersphere lattice constellations.

Rather than the conventional use of these codes for simple error correction in wireless communication and memory systems, the method leverages the codes for their distance properties. The codes maximize the Hamming distance on a base constellation, for which the Hamming distance is linearly proportional to the squared Euclidean distance over a cubic lattice, e.g., a base constellation of binary phase-shift keying (BPSK) on each dimension of the lattice.

In one embodiment, The extended Golay code is used as an example of near-perfect code, the code has a maximal gain for its rate, and provides excellent performance. The method maps codewords of an extended Golay code to a 24D hypercube to achieve a spectral efficiency of 1 bit per second per Hertz/polarization (b/s/Hz/pol). Herein, this format is called as 12-bit 24D Golay coded hypercube (12b-24D-GCHC).

With this modulated signal, the tolerance to additive white Gaussian noise (AWGN) is better than dual-polarization binary PSK (DP-BPSK) by 3 dB at a bit-error-rate (BER) of $10^{-3}$, and 1.9 dB at a BER of $10^{-2}$. In nonlinear fiber communications, the method can increase a maximal tolerable span loss of at least 4 dB compared to DP-BPSK and 8 dB compared to DP-QPSK.

Specifically, a system and method modulate data for optical communications by first encoding the data using a short block encoder to produce encoded data, such that Euclidean distances between high-dimensional lattice constellation points are increased. Then, the mapped data can be modulated for an optical channel.

The invention also provides several ways of mapping the coded high-dimensional lattice constellations onto optical carriers. Coherent optical carriers have 4D signals over two polarizations, and in-phase and quadrature phase. The embodiments provide a seamless way to map higher-than 4D constellations over polarization, phase, time, frequency, wavelength, and spatial modes.

The invention also provides a method for optimizing the BER by re-assigning the block coded word (codeword) to a lattice modulation. The method uses eigenvalue decomposition of the pairwise error probability to minimize a union bound of the BER at a target channel condition. This label optimization can be further improved by simulated annealing (SA).

To be more resilient against undesired errors, the invention uses long forward error correction (FEC) codes, such as low-density parity-check (LDPC) codes (Gallager codes), repeat accumulate codes, and turbo codes. The soft information from the short block decoder is fed into LDPC decoder to correct possible errors. In one embodiment, another low-overhead algebraic code such as Reed-Solomon (RS) codes or Bose-Chaudhuri-Hocquenghem (BCH) codes is concatenated to realize long term, e.g., years of error-free communications. The invention provides the method to optimize the LDPC codes for block-coded high-dimensional modulations in the presence of concatenated algebraic codes. In one embodiment, the soft-information from LDPC and BCH are fed back to a high-dimensional demodulator to improve the quality of digital communications.

BRIEF DESCRIPTION OF THE DRAWING

FIGS. 6A, 6B and 6C are block diagram example mappings for lattice-based coding according to embodiments of the invention.

DETAILED DESCRIPTION OF THE PREFERRED EMBODIMENTS

Figure 1:
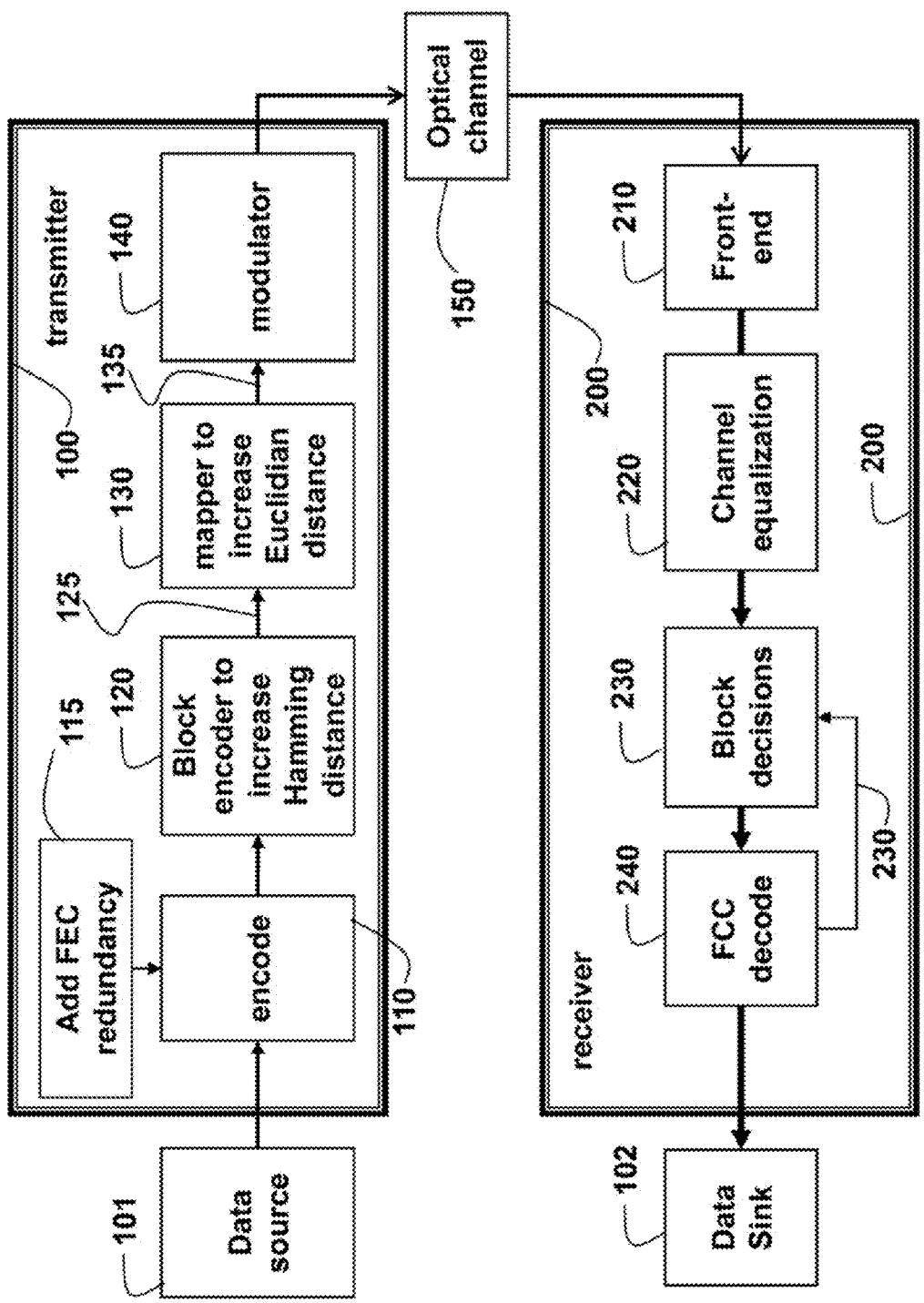
FIG. 1 is a block diagram of a system and method for modulating an optical signal according to embodiments of the invention.

FIG. 1 shows a system and method for modulating an optical signal according to embodiments of our invention. The system includes a transmitter 100 connected to a receiver 200 by an optical fiber channel 150.

At the transmitter, data from a source 101 is outer encoded 110. The outer encoder adds forward error correction (FEC) redundancy 115. Then, a block encoder is applied to an output of the outer encoder to produce encoded data 125. The block encoding is designed to increase the Hamming distances between constellation points that represent the data. A mapper 130 increases the Euclidian distances between constellation points to produce mapped data 135. Then, the code, in the form of the mapped data can be modulated 140 to a modulated signal that is transmitted through the optical channel 150. The transmission can use dense wavelength-division multiplexing (WDM), multi-mode spatial multiplexing, multi-core spatial multiplexing, sub-carrier signaling, single-carrier signaling, and combination thereof.

At the receiver, the steps of the transmitter are performed in a reverse order, wherein the modulated signal is demoduled, demapped, block-decoding, and FEC decoded to recover the data. Specifically, front-end processing 210 and channel equalization 220 are applied to the received optical modulated signal. A block decision 230 is made to feed the soft-decision information to outer decoding 240 to recover the data for a data sink 102.

24D Modulation Using a Golay-Coded Hypercube

To transmit the optical signal modulated with a 24-dimensional (4D) format over a 4D optical channel, we map a 24D orthogonal signal vector to a 4D optical carrier. To do so, we consider in-phase, quadrature-phase, polarization, and time as orthogonal dimensions.

Figure 2:
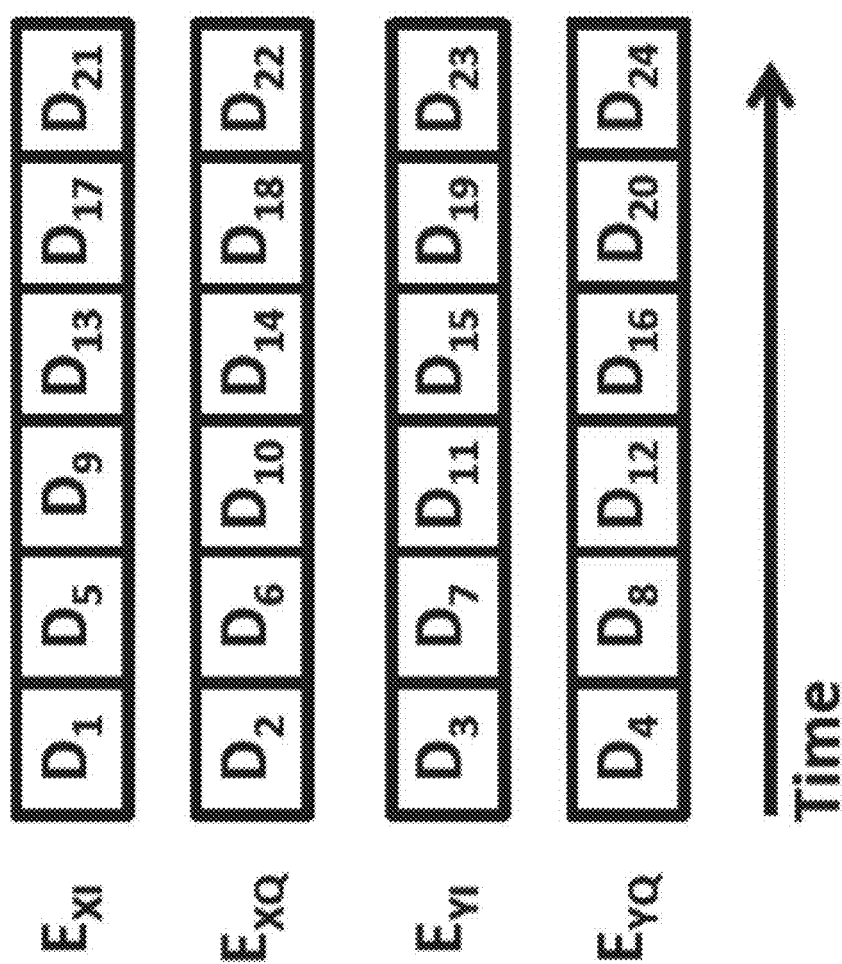
FIG. 2 is a block, diagram of a mapping according to embodiments of the invention.

FIG. 2 shows an example mapping of 24D basis vector ($D_1$, ..., $D_{24}$) to the 4D carrier in a time domain, where $E_{X_I}$ is the in-phase component of the optical carrier on the horizontal polarization, $E_{X_Q}$ is the quadrature component of the optical carrier on the horizontal polarization, $E_{Y_I}$ is the in-phase component on the vertical polarization, and $E_{Y_q}$ is the quadrature component on the vertical polarization.

In a Gray-coded hypercube constellation, i.e., a constellation where each dimension has it value ±1 that is independent of all other dimensions and every dimension is bit-labeled independently, the squared Euclidean distance between constellation points is linearly proportional to the Hamming distance. Therefore, we use a code designed to increase the Hamming distance and the Euclidean distance between constellation points. Taking advantage of this effect, we use the extended Golay code to determine a subset of the 24D hypercube. Then, the subset determines our constellation.

The extended Golay code encodes 12 bits of information into a 24-bit word with a minimum Hamming distance. While this code has been used with an appropriate decoding matrix to correct for errors in wireless communication and memories, we take maximum-likelihood (ML) decisions in 24D to maintain soft information for a forward-error correction (FEC) decoder.

Although conventional ML decisions for a 12 bit word in 24D are usually highly complex, we use a low-complexity demodulation of such formats, e.g., a multiplier five procedure based on correlation metric calculation. In another embodiment, the block decision can be done by using soft-information belief propagation Over a graphical representation (factor graph) of the block codes. It is also possible to use a lattice decoding or sphere decoding to reduce the complexity, which enables a practical implementation of the invention for short block sizes and real-time processing.

In 12b-24D-GCHC, the $2^{12}$ points that correspond to valid extended Golay codewords are our constellation points, from a possible $2^{24}$ points on the 24D hypercube. The minimum squared Euclidean distance increases by a factor of 8 compared with the 24D hypercube, which has identical performance to that of DP-QPSK, while the mean energy per hit is doubled. Therefore, asymptotic power efficiency is increased by 6 dB compared with the 24D hypercube. Because the constellation is a subset of the hypercube, the transmitter and receiver can be similar those used with DP-QPSK modulation.

Figure 3:
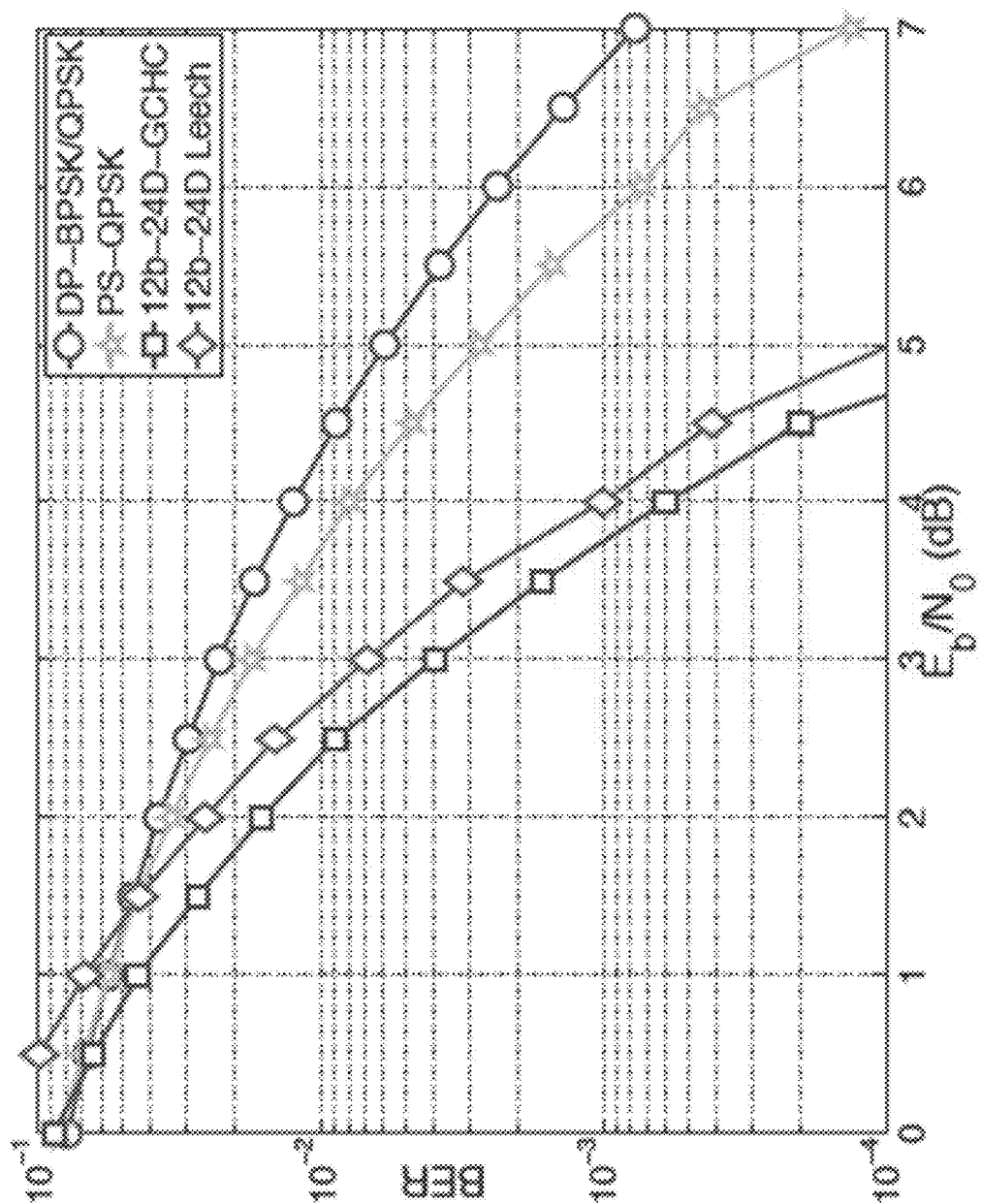
FIGS. 3, 4, and 5 compare performances of conventional coding and coding according to according to embodiments of the invention.

FIG. 3 compares the bit error rate (BER) performance over additive white Gaussian noise (AWGN) channels for noise sensitivity in dB for 12b-24D-GCHC, DP-BPSK/QPSK, PS-QPSK, and a 12b-24D Leech lattice. Surprisingly as an unexpected result, the noise sensitivity is reduced by 3 dB at a BER of $10^{-3}$ and by 1.5 dB at a BER of $10^{-3}$ against DP-BPSKQPSK. This is extremely favorably comparted to PS-QPSK, which is an optimal 4D format in terms of asymptotic power efficiency, which has a gain over DP-QPSK of 1 dB at a BER of $10^{-3}$ and by 0.6 dB at a BER of $10^{-2}$. in addition, 12b-24D-GCLIC has superior performance than a 12-bit 24D constellation based on spherical cutting of the Leech lattice, which is the densest known lattice in 24D. The performance gain of 12b-24D Leech compared to DP-QPSK is 2.8 dB at a BER of $10^{-3}$ and 1.6 dB at a BER of $10^{-2}$. This implies that optimization of labeling, and packing is difficult for such high-dimensional modulations, and that our hypercube lattice with linear codes can resolve its difficulty.

Figure 4:
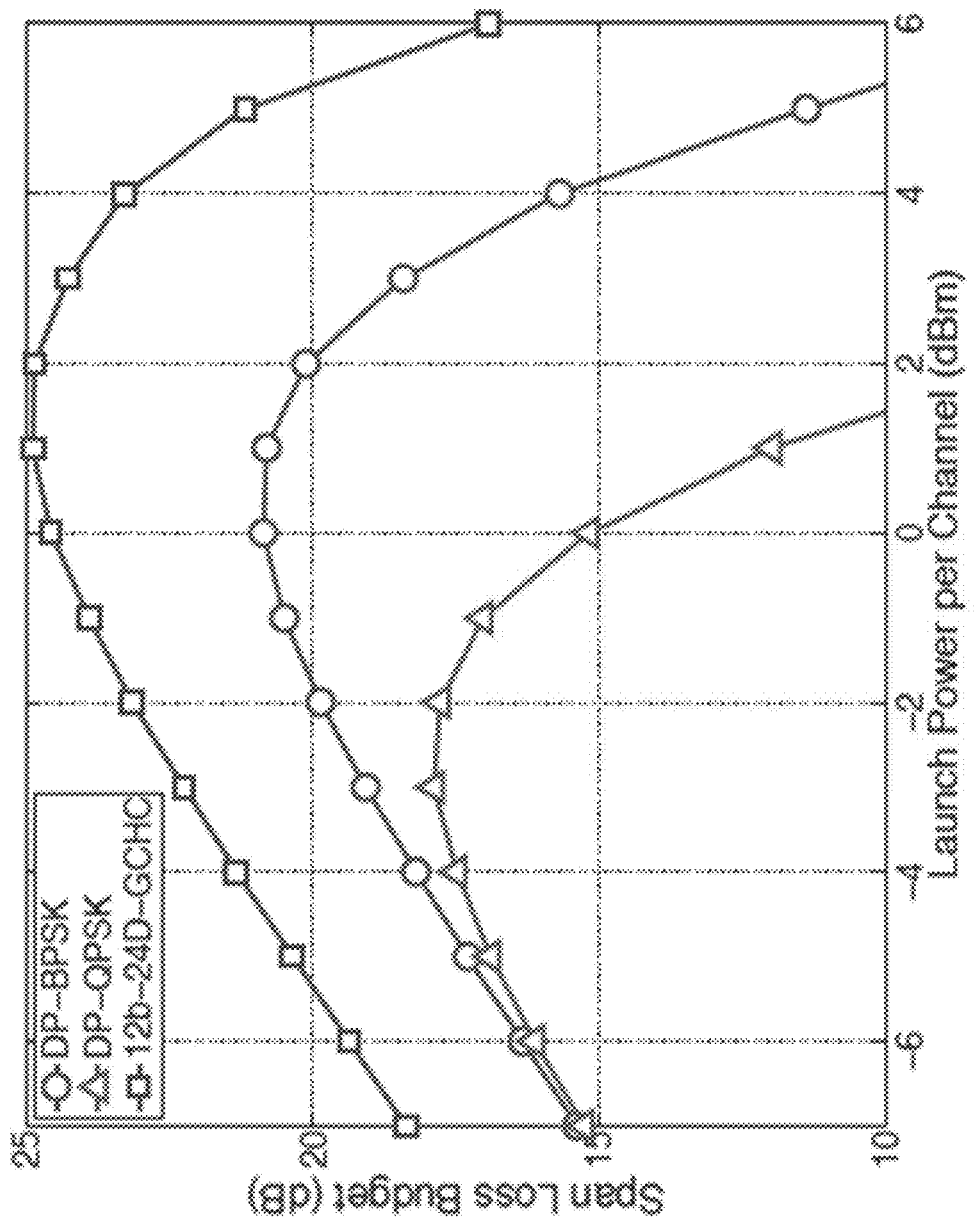
Figure 5:
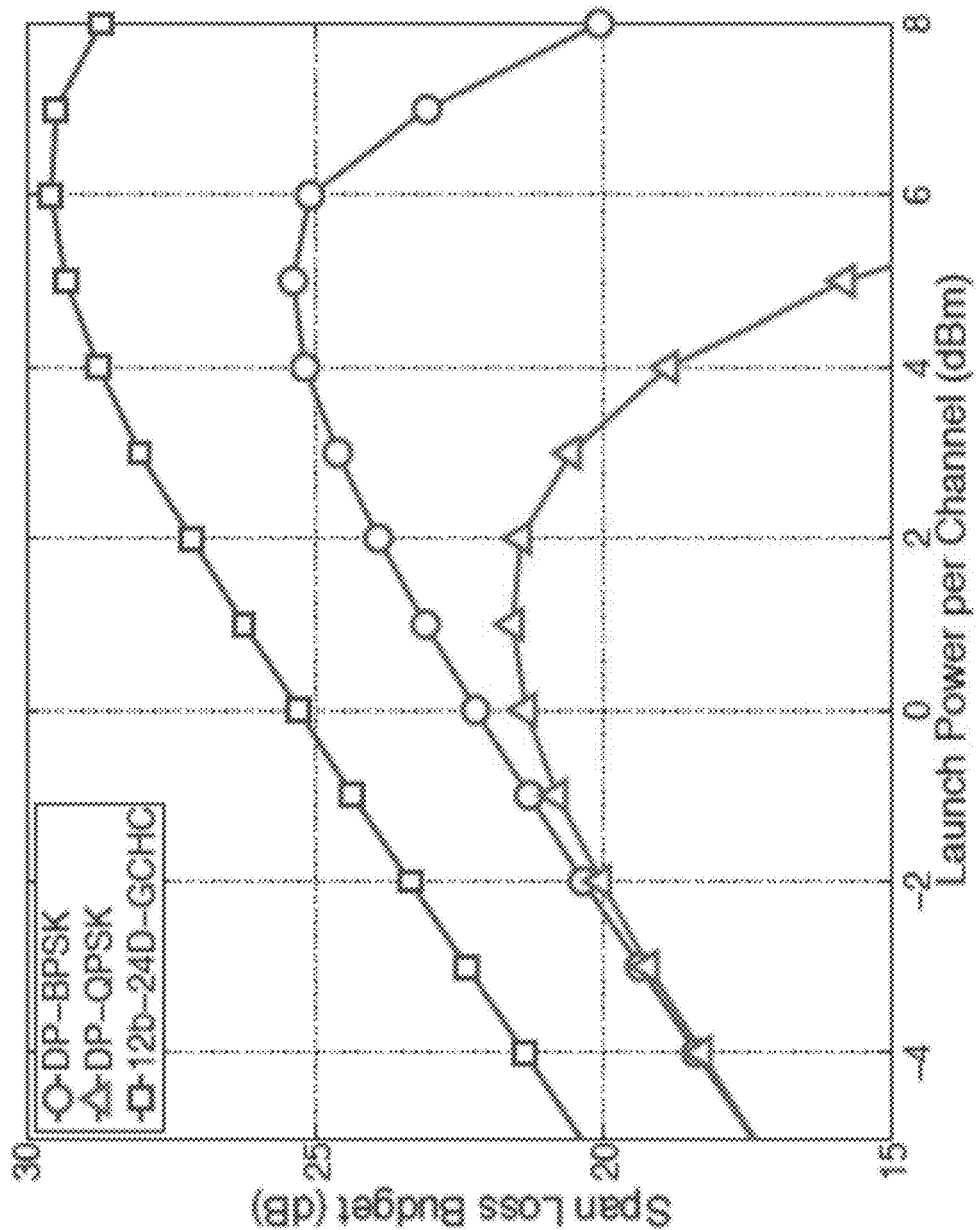

FIG. 4 shows span loss budget for 50-span transmission link with a target BER of $10^{-3}$ with 95% inline dispersion compensation per span, and FIG. 5 without inline dispersion compensation.

8D Modulation Using a Single Parity-Check Coded Hypercube

Another embodiment uses a single parity-check code to increase the Hamming distance for 8D hypercube lattice modulations. The 7-bit data are encoded by a block encoder to generate 8-bit coded word. Each bit is modulated by BPSK per dimension, and then 8-dimensional BPSK mapped to the 4D optical carrier. The decoder procedure is same as the previous embodiment. The benefit of the 8D modulation is lower complex in both the encoder and the decoder.

Higher-Dimensional Hypercube Lattice Modulation Using Near-Perfect Block Codes

Another embodiment Uses near-perfect block codes, which offers the maximum possible Hamming; distance over the hypercube lattice for a target data rate and dimensions. Near-perfect block codes include linear and nonlinear codes, or combinations of near-perfect codes. Using hypercube lattice, the increase of the Hamming distance can lead to the increase of Euclidean distance. Higher-dimensional lattice modulation can achieve better decoding for signals subject to linear and nonlinear noise.

In an alternative embodiment, we map the constellation to the 4D optical carrier using a densest hypersphere lattice. The block code is designed by greedy sphere cutting to sequentially select the closes points over high-dimensional lattice point.

Mapping High-Dimensional Lattice Constellations Onto Optical Carriers

To map high-dimensional lattice constellations, it is possible to use other mapping methods than the one shown in FIG. 6A. As other embodiments, example mapping are shown in FIGS. 6B and 6C. FIG. 6B has a benefit that each polarization signals become independent, and hence, it is more resistant to undesired polarization skewnes. FIG. 6C has an advantage that no precise 4D signal generator is required.

In another embodiment, other orthogonal bases, such as different frequency domain subcarriers, wavelengths, different fiber cores and spatial modes, can be used to map multi-dimensional constellations. The constellations can represent the data modulated by modulation scheme, such as quadrature amplitude modulation (QAM) and phase-shift keying (PSK). The constellation represents the data as a multi-dimensional scatter diagram in a complex plane at sampling instants.

Spatial-division multiplexing for optical communication on a 24D channel with 12 spatial and polarization modes is also suitable for 24D Golay-coded modulation. In this preferred embodiment, we use a 24D basis including six consecutive 4D symbols in time. Other possible mappings have similar performance in a linear regime.

Labeling Optimization to Minimize BER

The block-coded lattice modulation can maximize the minimal Euclidean distance over multiple bits, although there is no guarantee to minimize the BER. In the invention, an eigenvalue decomposition of the pairwise error probability matrix is used to minimize the union bound of the BIER at a target signal to noise ratio (SNR). The method first determines the pairwise error probability between all possible lattice constellations. Using a graph spectrum technique, only a small number of dominant eigenvectors can be obtained by eigenvalue decomposition of nonnegative matrix, i.e., a pairwise error probability table. The eigenvectors can partition the bit labeling by its sign. After the eigen set-partitioning, simulated annealing (SA) is used to refine the labeling to minimize the BER.

FEC Optimization for High-Dimensional Lattice Modulations

The method of the invention use different FEC codes for different modulations. Using extrinsic information transfer (EXIT) chart analysis of LDPC codes, the edge degree distribution can be optimized for different high-dimensional modulations. Rather than fitting the EXIT curves conventionally, the invention uses a mutual information trajectory for practical finite iteration decoding. In one embodiments, the FEC codes can have the LDPC code with a concatenation of another algebraic codes such as BCH and Reed-Solomon (RS) codes. The LDPC optimization directly takes into account the error correction capability of the algebraic codes to design the degree distribution. This modification can enhance the performance by excluding the constraint of EXIT curve convergence at high SNR regimes.

To improve performance further, one embodiment feeds soft-decision information 135 back from the FEC decoder to a short block-coded modulation decoder. This turbo iteration can reduce the remaining errors, although the complexity can increase.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for modulating data for optical communication, comprising:
   encoding the data using a forward error correction (FEC) encoder to produce encoded data;
   encoding the encoded data using a block encoder to produce block encoded data such that Hamming distances between constellation points that represent the block encoded data are increased, wherein the block encoder assigns a codeword to the constellation points to minimize a bit error rate (BER) by label optimization based on eigen set partitioning and simulated annealing;
   mapping the block encoded data to produce mapped data such that Euclidian distances between the constellation points are increased; and
   modulating, in a transmitter, the mapped data to a modulated signal for an optical channel.

2. The method of claim 1, wherein the block encoder uses a near-perfect code.

3. The method of claim 2, wherein the near-perfect code is selected from a group consisting of a linear code, a nonliner code, an extended Golay code for a 24-dimensional (24D) hypercube, a single-parity-check code for an 8D hypercube lattice, and combinations thereof.

4. The method of claim 1, wherein the block encoder uses nonlinear codes designed by greedy sphere cutting for a hypersphere lattice.

5. The method of claim 1, wherein the mapping uses any combinations of orthogonal bases, including polarization, phase, time, frequency, wavelength, spatial mode, and fiber core.

6. The method of claim 1, wherein the modulating includes a hypercube lattice or a hypersphere lattice based on a densest high-dimensional lattice packing.

7. The method of claim 1, further comprising:
   demodulating, demapping, block-decoding, and FEC decoding the modulated signal in a receiver to recover the data.

8. The method of claim 7, wherein the block-decoding uses a maximum-likelihood decision or a maximum a posteriori decision to feed soft-decision information to the FEC decoding.

9. The method of claim 7, wherein the decoding is based on correlation metric calculation, belief propagation, or sphere decoding.

10. The method of claim 7, wherein soft-decision information from the FEC decoding is used to refine the block-decoding.

11. The method of claim 1, wherein the FEC encoder uses a low-density parity-check (LDPC) code, repeat accumulate code, or turbo code as a capacity-approaching error correcting code.

12. The method of claim 11, wherein the LDPC code uses extrinsic information transfer (EXIT) chart analysis of high-dimensional lattice modulation with a mutual information trajectory.

13. The method of claim 1, wherein the FEC codes uses a concatenation of a low-density parity-check (LDPC) code and algebraic codes.

14. The method of claim 13, wherein the algebraic code is a Reed-Solomon (RS) code, Reed-Muller (RM), or a Bose-Chaudhuri-Hocquenghem (BCH) code.

15. The method of claim 1, wherein the Hamming distances are linearly proportional to the squared Euclidean distances over a cubic lattice.

16. The method of claim 15, wherein the cubic latice is a base constellation of binary phase-shift keying (BPSK) on each dimension of the lattice.

17. A system for modulating data for optical communication, comprising:
   a forward error correction (FEC) encoder configured to produce encoded data from the data;
   a block encoder configured to produce block encoded data such that Hamming distances between constellation points that represent the block encoded data are increased, wherein the block encoder assigns a codeword to the constellation points to minimize a bit error rate (BER) by label optimization based on eigen set partitioning and simulated annealing;
   a mapper configure to produce mapped data from the block encoded data such that Euclidian distances between the constellation points are increased; and
   a transmitter configured to modulate the mapped data to a modulated signal for an optical channel.

18. The system of claim 17, wherein the optical channel includes coherent optical fibers, noncoherent optical fibers, or a free-space lightwave medium.

19. The system of claim 17, wherein the transmission is selected from the group consisting of dense wavelength-division multiplexing (WDM), multi-mode spatial multiplexing, multi-core spatial multiplexing, sub-carrier signaling, single-carrier signaling, and combination thereof.

* * * * *